United States Patent
Greene et al.

(10) Patent No.: US 10,325,848 B2
(45) Date of Patent: Jun. 18, 2019

(54) SELF-ALIGNED LOCAL INTERCONNECT TECHNOLOGY

(71) Applicants: INTERNATIONAL BUSINESS MACHINES CORPORATION, Armonk, NY (US); GlobalFoundries, Inc., Grand Cayman (KY)

(72) Inventors: Andrew M. Greene, Albany, NY (US); Injo Ok, Loudonville, NY (US); Balasubramanian Pranatharthiharan, Watervliet, NY (US); Charan V. V. S. Surisetty, Clifton Park, NY (US); Ruilong Xie, Niskayuna, NY (US)

(73) Assignees: INTERNATIONAL BUSINESS MACHINES CORPORATION, Armonk, NY (US); GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 16/127,645

(22) Filed: Sep. 11, 2018

(65) Prior Publication Data

US 2019/0013268 A1    Jan. 10, 2019

Related U.S. Application Data

(63) Continuation of application No. 15/484,309, filed on Apr. 11, 2017, which is a continuation of application
(Continued)

(51) Int. Cl.
*H01L 29/49* (2006.01)
*H01L 23/528* (2006.01)
(Continued)

(52) U.S. Cl.
CPC .......... *H01L 23/528* (2013.01); *H01L 21/283* (2013.01); *H01L 21/30604* (2013.01); *H01L 21/3205* (2013.01); *H01L 21/32133* (2013.01); *H01L 21/76829* (2013.01); *H01L 21/76831* (2013.01); *H01L 21/76877* (2013.01); *H01L 21/76895* (2013.01); *H01L 21/76897* (2013.01);
(Continued)

(58) Field of Classification Search
None
See application file for complete search history.

(56) References Cited

U.S. PATENT DOCUMENTS 6,180,530 B1 * 1/2001 Liaw ................. H01L 21/76897
257/E21.507
9,698,101 B2   7/2017 Greene et al.
(Continued)

OTHER PUBLICATIONS

List of IBM Patents or Patent Applications Treated as Related; (Appendix P), Sep. 13, 2018, 2 pages.

*Primary Examiner* — Cory W Eskridge
(74) *Attorney, Agent, or Firm* — Cantor Colburn LLP; Vazken Alexanian

(57) ABSTRACT

A self-aligned interconnect structure includes a fin structure patterned in a substrate; an epitaxial contact disposed over the fin structure; a first metal gate and a second metal gate disposed over and substantially perpendicular to the epitaxial contact, the first metal gate and the second metal gate being substantially parallel to one another; and a metal contact on and in contact with the substrate in a region between the first and second metal gates.

20 Claims, 22 Drawing Sheets

Related U.S. Application Data

No. 14/839,108, filed on Aug. 28, 2015, now Pat. No. 9,698,101.

(51) Int. Cl.
    *H01L 29/78*     (2006.01)
    *H01L 29/66*     (2006.01)
    *H01L 21/768*     (2006.01)
    *H01L 21/306*     (2006.01)
    *H01L 21/3205*     (2006.01)
    *H01L 21/283*     (2006.01)
    *H01L 21/3213*     (2006.01)
    *H01L 21/8234*     (2006.01)
    *H01L 29/417*     (2006.01)
    *H01L 27/088*     (2006.01)

(52) U.S. Cl.
    CPC .. *H01L 21/823431* (2013.01); *H01L 27/0886* (2013.01); *H01L 29/41791* (2013.01); *H01L 29/4916* (2013.01); *H01L 29/6681* (2013.01); *H01L 29/66545* (2013.01); *H01L 29/785* (2013.01)

(56) References Cited

U.S. PATENT DOCUMENTS

| | | | |
|---|---|---|---|
| 2003/0116819 A1* | 6/2003 | Hokazono | H01L 21/76224 257/510 |
| 2011/0079827 A1* | 4/2011 | Ellis-Monaghan | H01L 21/76816 257/288 |
| 2013/0146986 A1* | 6/2013 | Rashed | H01L 21/823418 257/369 |
| 2017/0221808 A1 | 8/2017 | Greene et al. | |

* cited by examiner

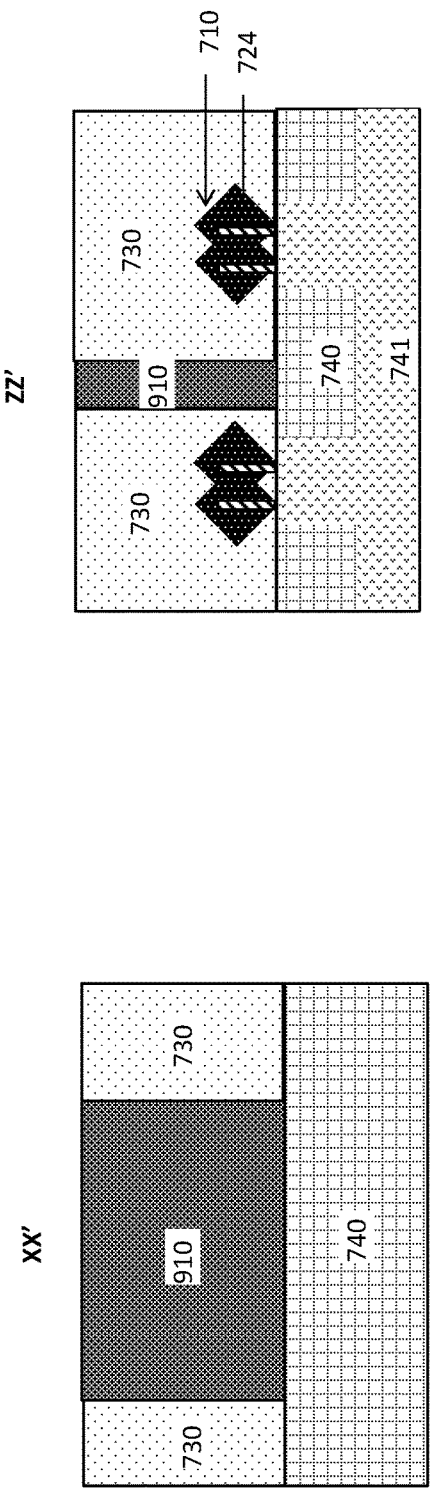
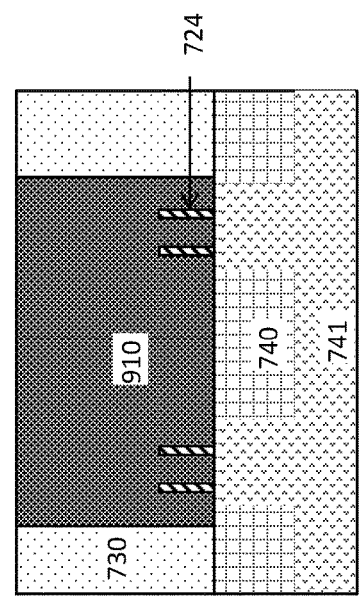
FIG. 9B
FIG. 9C
FIG. 9A

SELF-ALIGNED LOCAL INTERCONNECT TECHNOLOGY

PRIORITY

This application is a continuation of and claims priority from U.S. patent application Ser. No. 15/484,309, filed on Apr. 11, 2017, which is a continuation of and claims priority from U.S. patent application Ser. No. 14/839,108, filed on Aug. 28, 2015, the entire contents of both applications are incorporated herein by reference.

BACKGROUND

The present invention generally relates to metal-oxide-semiconductor field-effect transistors (MOSFET), and more specifically, to MOSFET interconnect technology.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the majority current carriers and is built directly in a p substrate with n-doped source and drain junctions. The PFET uses holes as the majority current carriers and is built in an n-well with p-doped source and drain junctions.

The fin-type field effect transistor (FinFET) is a type of MOSFET. The FinFET contains a conformal gate around the fin that mitigates the effects of short channels and reduces drain-induced barrier lowering. The "fin" refers to the narrow channel between source and drain regions. A thin insulating high-k gate oxide layer around the fin separates the fin channel from the gate metal.

SUMMARY

In one embodiment of the present invention, a self-aligned interconnect structure includes a fin structure patterned in a substrate; an epitaxial contact disposed over the fin structure; a first metal gate and a second metal gate disposed over and substantially perpendicular to the epitaxial contact, the first metal gate and the second metal gate being substantially parallel to one another; and a metal contact on and in contact with the substrate in a region between the first and second metal gates.

In another embodiment, a method for making a self-aligned interconnect structure includes patterning a fin structure in a substrate; growing an epitaxial contact over the fin structure by an epitaxial growth process; forming a first gate and a second gate over and substantially perpendicular to the epitaxial contact, the first gate and the second gate being substantially parallel to one another; patterning a contact in a region between the first gate and the second gate; and filling the contact, the first gate, and the second gate with a gate metal, the contact being positioned on and in contact with the substrate in a region between the first and second gates.

Yet, in another embodiment, a method for making a self-aligned interconnect structure includes patterning a fin structure in a substrate; growing an epitaxial contact over the fin structure by an epitaxial growth process; forming a first gate and a second gate over and substantially perpendicular to the epitaxial contact, the first gate and the second gate being substantially parallel to one another and including amorphous silicon; removing the amorphous silicon from the first gate and the second gate; patterning and etching through an inter-layer dielectric layer (ILD) between the first and second gates to form a contact pattern; and filling the contact pattern, the first gate, and the second gate with a gate metal, the contact being positioned on and in contact with the substrate in a region between the first and second gates.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 2A-6C illustrate a method of forming self-aligned contacts according to a first embodiment of the present invention, in which:

FIG. 2A is a top view of replacement gates formed over fin channels with epitaxial source/drain contact growth;

FIGS. 6A, 6B, and 6C are cross-sectional side views through the XX', ZZ', and YY' planes, respectively, after high-k oxide and metal gate stack deposition, self-aligned contact capping layer deposition, and planarization;

FIGS. 7A-9C illustrate a method of forming self-aligned contacts according to a second embodiment of the present invention, in which:

FIG. 7A is a top view of amorphous silicon filled replacement gates formed over fin channels with epitaxial source/drain contact growth;

FIGS. 9A, 9B, and 9C are cross-sectional side views through the XX', ZZ', and YY' planes, respectively, after high-k oxide and metal gate stack deposition;

FIGS. 10A-12B illustrate a method of forming self-aligned contacts according to a third embodiment of the present invention, in which:

FIG. 10A is a top view of metal gates over fin channels with epitaxial source/drain contact growth;

FIGS. 12A and 12B cross-sectional side views through the XX' and and ZZ' planes, respectively, after metal gate deposition and planarization.

DETAILED DESCRIPTION

Figures 1A, 1B:
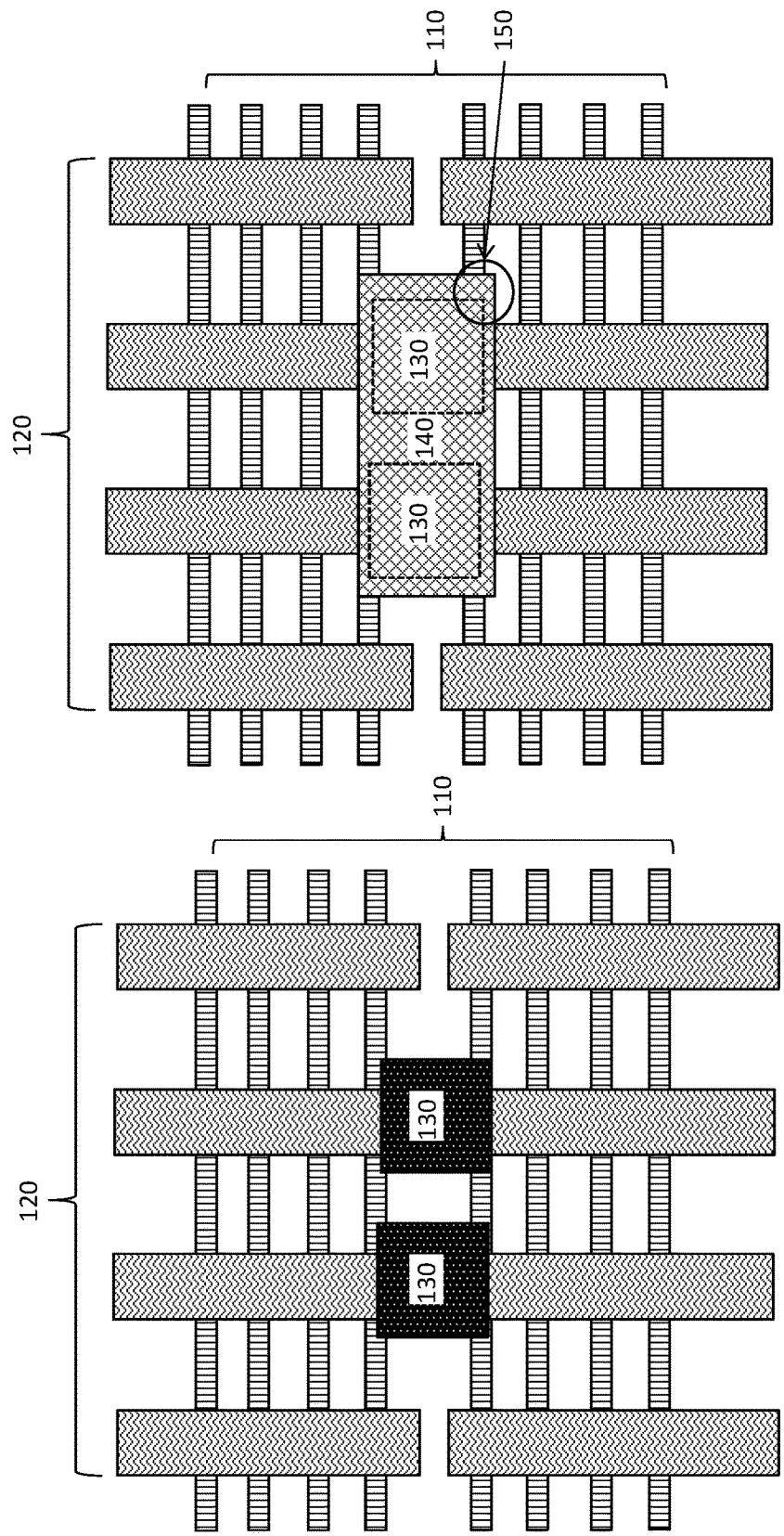
FIGS. 1A and 1B are top views of a conventional gate-to-gate contact.

As stated above, the present invention relates to MOSFETs, and particularly to interconnect technology, which are now described in detail with accompanying figures. It is noted that like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Overlap of gate contacts with adjacent fins can result in shorting, particularly as devices are scaled down to the 7 nanometer (nm) foot-print. Additionally, gate contact pattern overlay and lithography tolerance presents a challenge for successful contact landing on gates. FIGS. 1A and 1B illustrate a conventional MOSFET gate interconnect. As shown in FIG. 1A, gates 120 are disposed over fins 110. Narrow metal contacts 130 (also known as "CB-to-PC" or simply "CB") are formed on the top of the metal gates 120 (see FIG. 1A). Another metal layer (see FIG. 1B) is then formed over the narrow metal CB contacts 130 in order to electrically connect the adjacent gates to form the gate interconnect 140. Shorting in the region 150 between the gate interconnect 140 and adjacent fins 110 occurs due to the short distance between the interconnect 140 and the fins 110 and because the gate interconnect 140 is not in the same parallel plane as the gates 120. CB pattern overlay and alignment to the PC below can also miss the desired PC connection and short to adjacent PCs. As MOSFET scaling continues, interconnect pattern density and overlap alignment will be increasingly problematic.

Figure 1C:
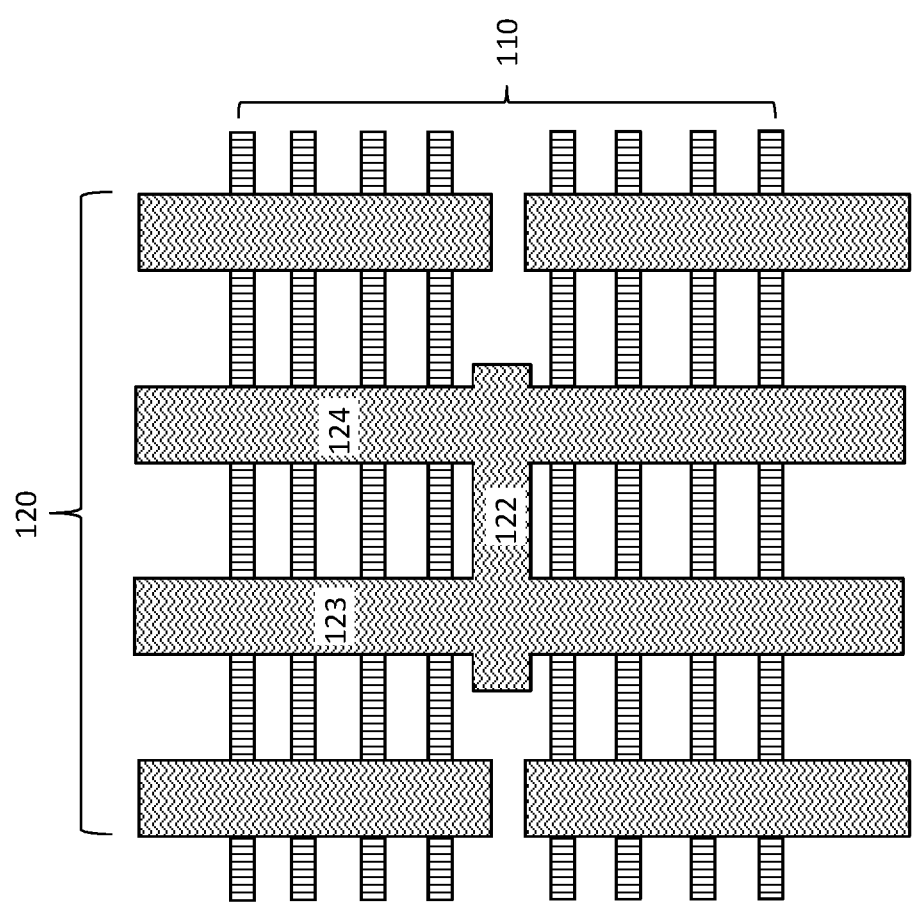
FIG. 1C is a top view of a gate-to-gate contact (local interconnect) as described herein.

Accordingly, disclosed herein is a gate-to-gate contact (local interconnect 122) formed in the same plane of the gates. As shown in FIG. 1C, a self-aligned shared interconnect 122 forms a bridge between adjacent gates, which eliminates the problem of shorting due to fin and gate contact overlap. The gates 120 are formed over the fins 110 patterned from a substrate. Epitaxial contacts (not shown) forming source and drain regions on opposing sides of the gates are positioned over the fins 110. A first metal gate 123 and a second metal gate 124 are substantially parallel to one another and define an axis that is substantially parallel to the substrate (and fins). The interconnect structure 122 is formed from a metal contact connecting the first metal gate 123 to the second metal gate 124. The interconnect structure 122 is positioned in the same parallel axis as the first and second metal gates 123 and 124 (in the same plane). In contrast to FIG. 1B, where the interconnect structure 140 is formed above the active gates and CB level of metallization (not in the same plane), the inventive interconnect structure 122 directly connects the gates in the same parallel plane. The inventive interconnect structure 122, as described below, is on an in contact with the substrate in a region between the gates. The self-aligned shared interconnect structure 122 is formed by methods described in various embodiments, which are described in detail below.

Figure 2B:
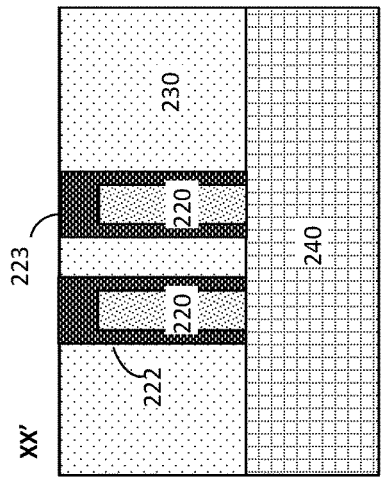
FIGS. 2B, 2C, and 2D are cross-sectional side view through the XX', YY', an ZZ' planes of FIG. 2A.
Figure 2D:
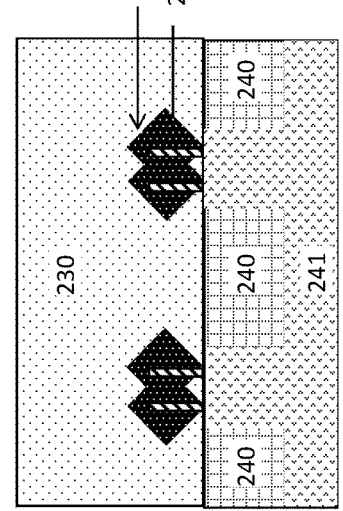
Figure 2A:
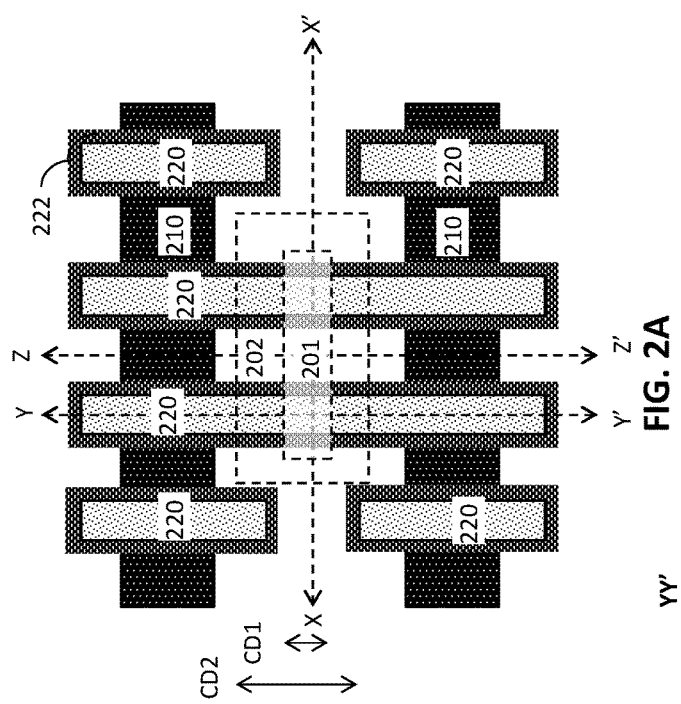
Figure 2C:
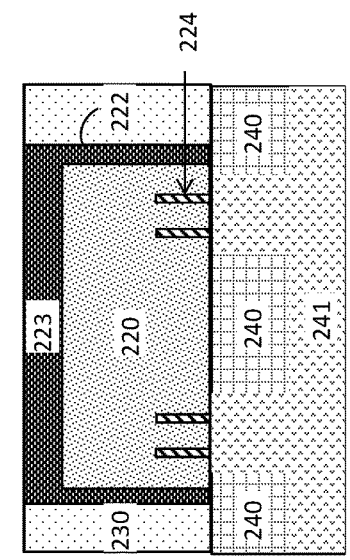

FIGS. 2A-6C illustrate a first embodiment according to the present invention. FIG. 2A is a top view of replacement gates 220 formed over active fin channels with epitaxial contacts 210 (not shown). FIGS. 2B, 2C, and 2D are cross-sectional side view through the XX', YY', and ZZ' planes of FIG. 2A. Note that, for simplicity, FIG. 2A does not show the ILD layer 230 or the hard mask layer 223 shown in FIGS. 2B, 2C, and 2D.

Initially, fins 224 are patterned and etched into an underlying substrate 241 and separated by shallow trench isolation (STI) regions 240. The fins 224 may be formed from a substrate 241 made of, for example, silicon, silicon germanium, or other suitable semiconductor material. A sacrificial insulator layer (not shown) surrounds the fins 224. A STI etching and dielectric fill process is performed to form the STI regions 240 between sets of fins. The STI regions 240 are isolation regions formed by etching trenches in the substrate 241 and then filling the trenches with, for example, silicon oxide. Alternatively, the trenches may be lined with a silicon oxide liner formed by a thermal oxidation process and then filled with additional silicon oxide or another material.

Replacement gates 220 ("dummy gates") are formed over the fins 224. The replacement gates 220 are filled with a suitable replacement material, for example, amorphous silicon (polysilicon). An insulating hard mask layer 223 for example, silicon nitride (SiN), SiOCN, or SiBCN is deposited on the replacement gate silicon to form a PC hard mask. The replacement gate 220 is then patterned and etched into the silicon and hard mask layer 223 to form high aspect-ratio replacement gates over the substrate 241. An insulating liner material, for example, silicon nitride (SiN), SiOCN, or SiBCN, is deposited over the replacement gates 220, and then a reactive ion etch (RIE) process is performed to form spacers 222 surrounding the replacement gates 220.

To form the n-type (or p-type) epitaxial contacts 210 around the fins 224, an organic patterning stack (not shown) is applied over the p-type gate (or n-type gate) replacement gate 220 and patterned. A directional RIE process is performed to remove the spacer material (220) to expose the underlying fins 224. An epitaxial growth process over the fins 224 forms the source and drain regions. Suitable materials for the epitaxial contacts 210 depend on the type of MOSFET (n-type or p-type). Non-limiting examples of suitable materials include silicon or silicon-germanium containing p-type dopants (e.g., boron), n-type dopants (e.g., phosphorus), or any combination thereof. A low-k dielectric oxide forming the ILD layer 230 is then disposed over the epitaxial contacts 210 to form the structures shown in FIGS. 2B, 2C, and 2D. The ILD layer 230 may be formed from, for example, a low-k dielectric oxide, including but not limited to, spin-on-glass, a flowable oxide, a high density plasma oxide, or any combination thereof.

Figure 2F:
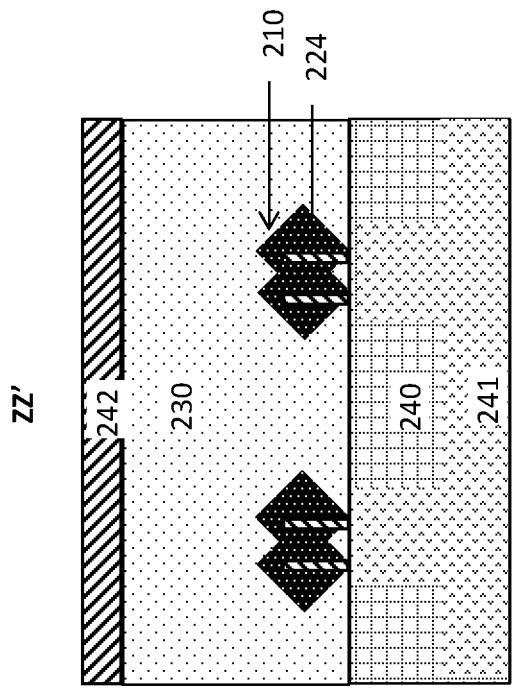
FIGS. 2E and 2F are cross-sectional side views through the XX' and ZZ' planes, respectively, after disposing a sacrificial patterning layer over the inter-layer dielectric (ILD) layer.
Figure 2E:
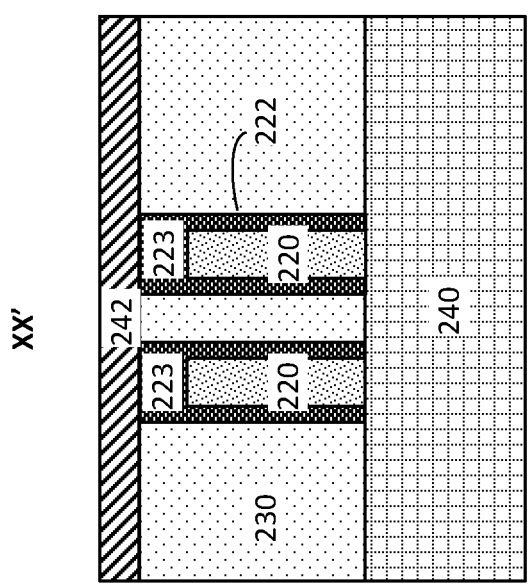

FIGS. 2E and 2F are cross-sectional side views through the XX' and ZZ' planes, respectively, after disposing a sacrificial patterning layer 242 over the ILD layer 230. Non-limiting examples of suitable materials for the sacrificial patterning layer 242 include aluminum oxide ($AlO_3$), hafnium oxide ($HfO_2$), titanium nitride (TiN), or amorphous silicon. The sacrificial patterning layer 242 can be deposited by any suitable method depending on the type of material and can be, for example, plasma-enhanced chemical vapor deposition (PECVD) or atomic layer deposition (ALD).

Figure 2H:
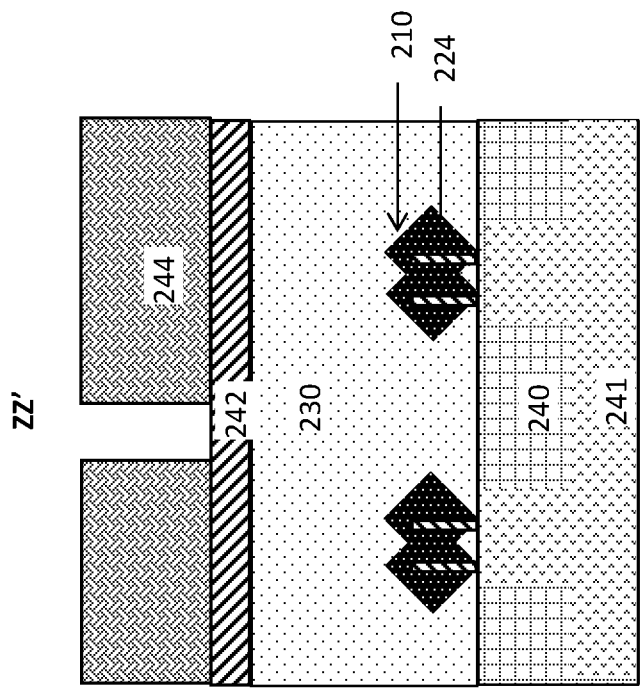
FIGS. 2G and 2H are cross-sectional side views through the XX' and ZZ' planes, respectively, after forming an interconnect patterning stack over the sacrificial patterning layer.
Figure 2G:
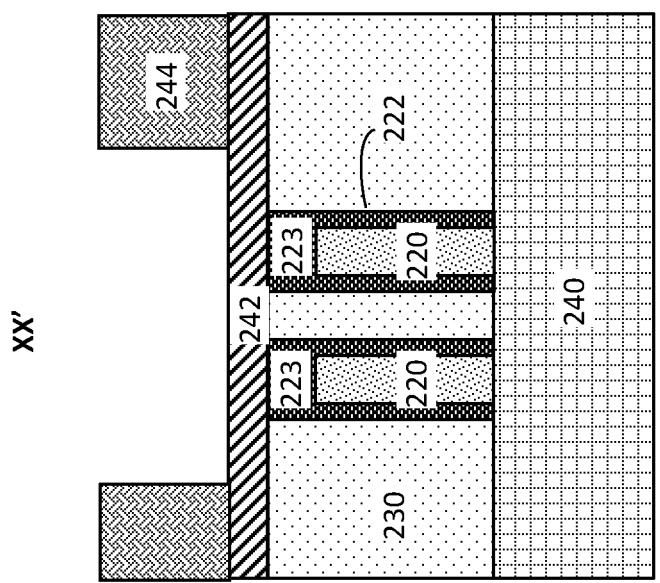

FIGS. 2G and 2H are cross-sectional side views through the XX' and ZZ' planes, respectively, after forming an interconnect patterning stack 244 over the sacrificial patterning layer 242. The interconnect patterning stack 244 includes an organic planarizing layer (OPL), anti-reflective coating (ARC), and photoresist. The interconnect patterning stack 244 provides a narrow pattern (see pattern 201 in FIG. 2A) for forming the interconnect between gates. Accordingly, the narrow critical dimension (CD) will prevent shorting with the epitaxial contacts 210. Even if the target pattern 201 was misaligned in any direction, the CD (CD1) would remain relatively small.

Figure 2J:
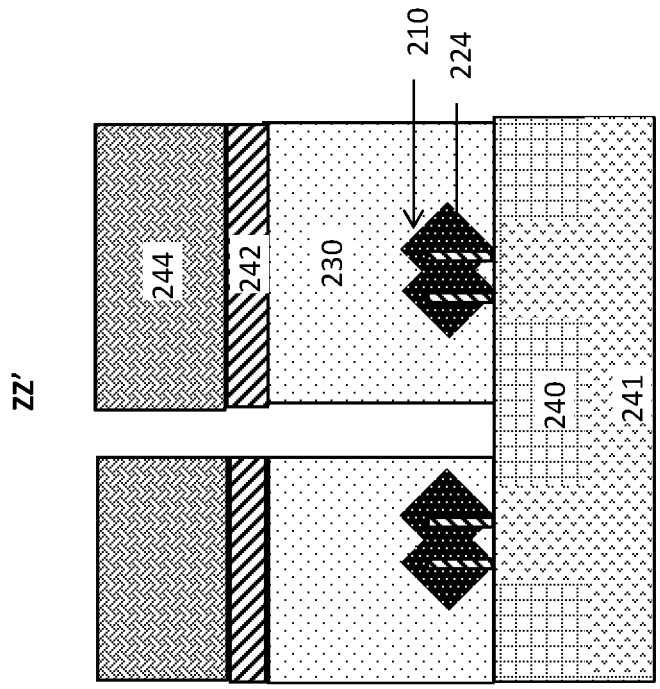
FIGS. 2I and 2J are cross-sectional side views through the XX' and ZZ' planes, respectively, after etching through the sacrificial patterning layer and the ILD layer.
Figure 2I:
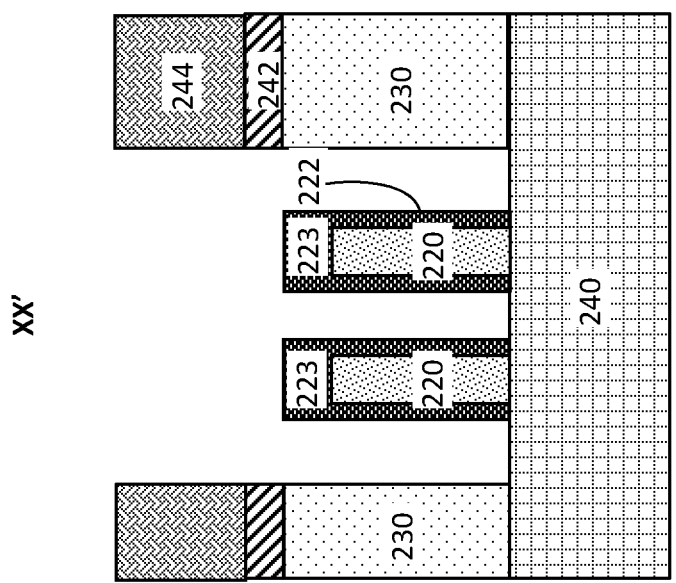

FIGS. 2I and 2J are cross-sectional side views through the XX' and ZZ' planes, respectively, after etching through the sacrificial patterning layer 242 and the ILD layer 230 to expose the replacement gates 220. The etching process is selective to the spacer 222 material and hard mask material layer 223.

Figure 2L:
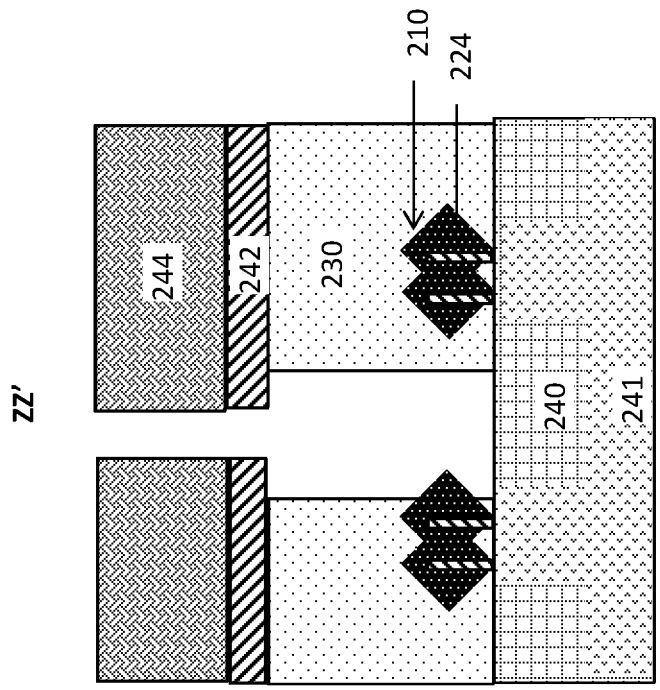
FIGS. 2K and 2L are cross-sectional side views through the XX' and ZZ' planes, respectively, after lateral isotropic etching into the ILD layer.
Figure 2K:
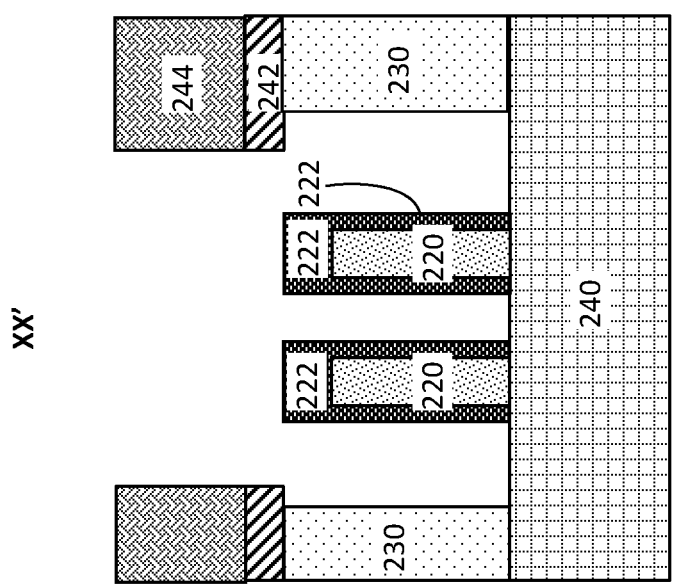

FIGS. 2K and 2L are cross-sectional side views through the XX' and ZZ' planes, respectively, after lateral etching through the ILD layer 230. A selective wet etch (e.g., a buffered HF etch) or dry etch (e.g., isotropic RIE or chemical oxide removal (COR)) may be used. The lateral etch process is performed to increase the CD (CD1) of the interconnect pattern to meet the resistance necessary for the local interconnect. As shown in FIG. 2A, the pattern 201 increases in size to a pattern 202 with a larger CD (CD2).

Figure 3B:
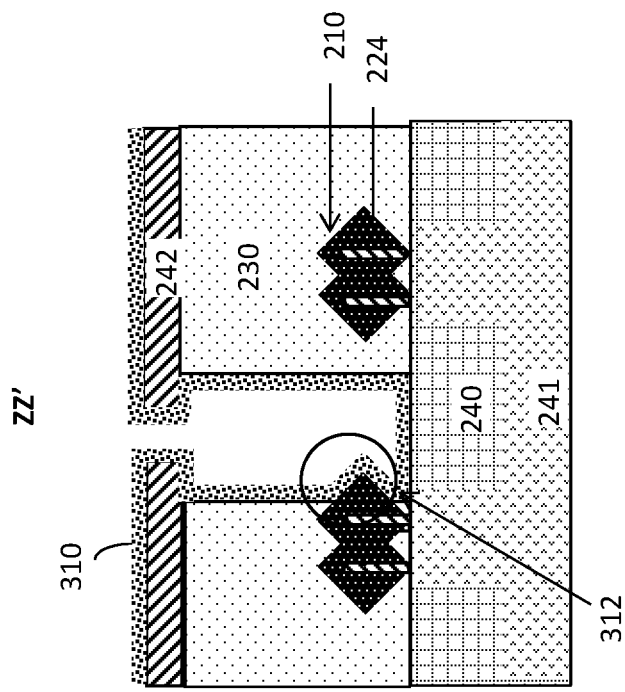
FIGS. 3A and 3B are cross-sectional side views through the XX' and ZZ' planes, respectively, after removing the interconnect patterning stack and depositing a silicon nitride (SiN) liner.
Figure 3A:
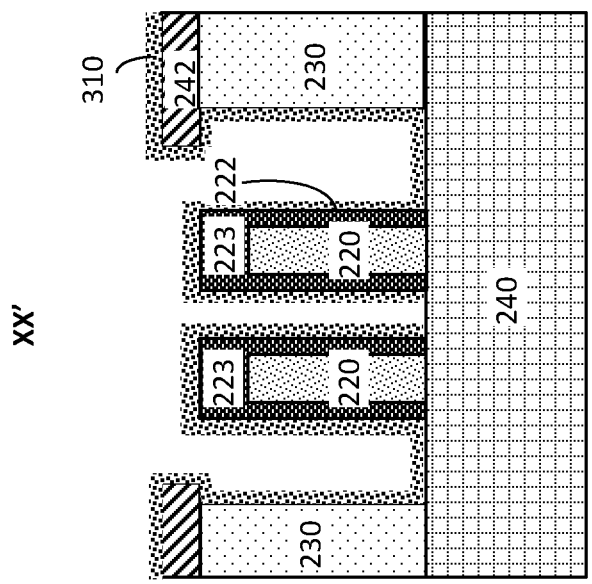

FIGS. 3A and 3B are cross-sectional side views through the XX' and ZZ' planes, respectively, after selectively removing the interconnect patterning stack 244 and depositing a conformal silicon nitride (SiN) liner 310. The potential short region 312 over the epitaxial contact 210 is sealed with SiN, which will prevent any shorting between the epitaxial contact 210 and the gate. The SiN liner 310 is deposited by a conformal process such as ALD.

The thickness of the SiN liner 310 is tailored to provide a minimum thickness to prevent shorting. The thickness of the SiN liner 310 is in a range from about 2 nm to about 12 nm. The desired thickness of the SiN liner 310 is dependent on the interconnect pattern CD after lateral etching to ensure there is no liner pinch-off at the top of the etched interconnect trench. Thickness also needs to be suitable to completely cover and isolate any exposed epitaxial contact regions which were exposed during lateral dielectric etching.

Figure 4B:
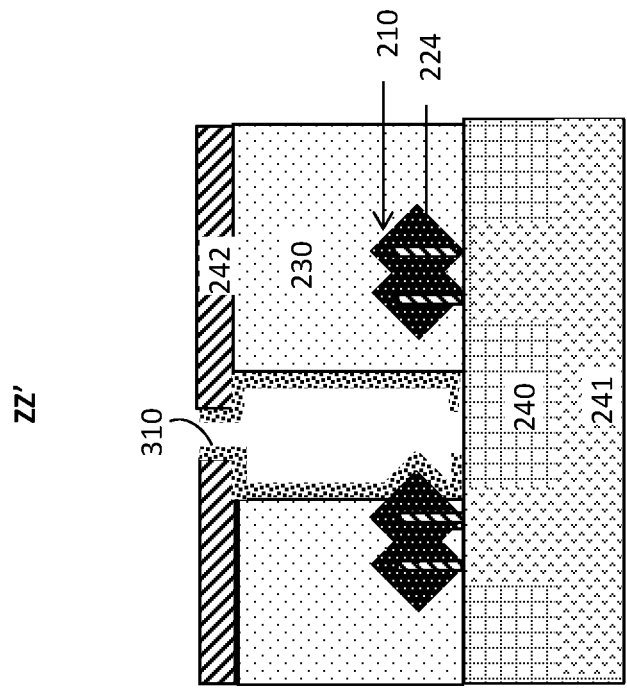
FIGS. 4A and 4B are cross-sectional side views through the XX' and ZZ' planes, respectively, after reactive-ion etching (RIE) the gate spacers.
Figure 4A:
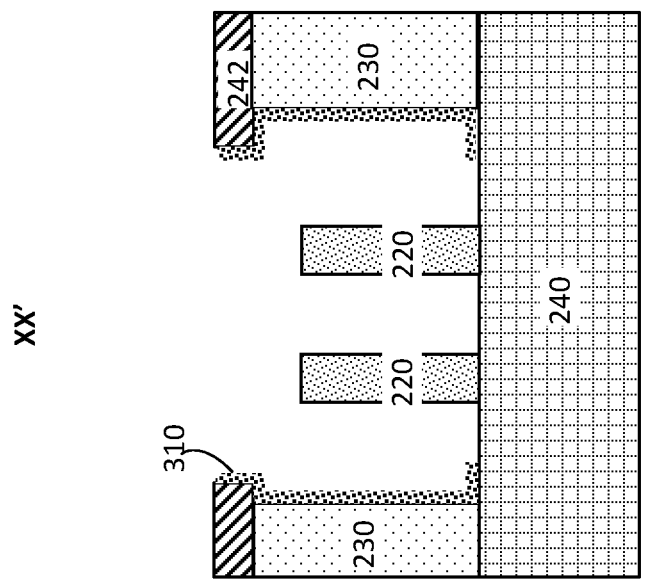

FIGS. 4A and 4B are cross-sectional side views through the XX' and ZZ' planes, respectively, after etching to remove the SiN liner 310 and the spacers 222 from around the replacement gates 220. The etching can be performed by a RIE process, which is a directional anisotropic etch to remove material from lateral surfaces but not on undercut sidewalls, such as on the ILD layer 230. The RIE process exposes the remaining replacement gate 220 and opens up the region for forming the inventive interconnect on the same spatial level as the gates.

Figure 4D:
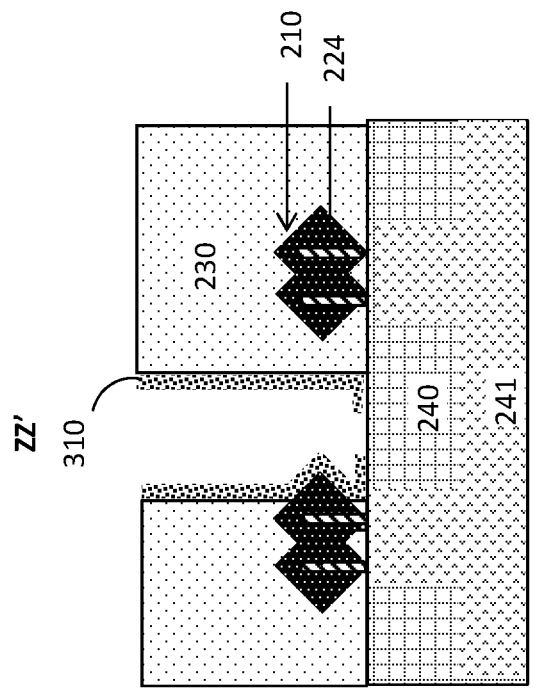
FIGS. 4C and 4D are cross-sectional side views through the XX' and ZZ' planes, respectively, after etching to remove the sacrificial patterning layer.
Figure 4C:
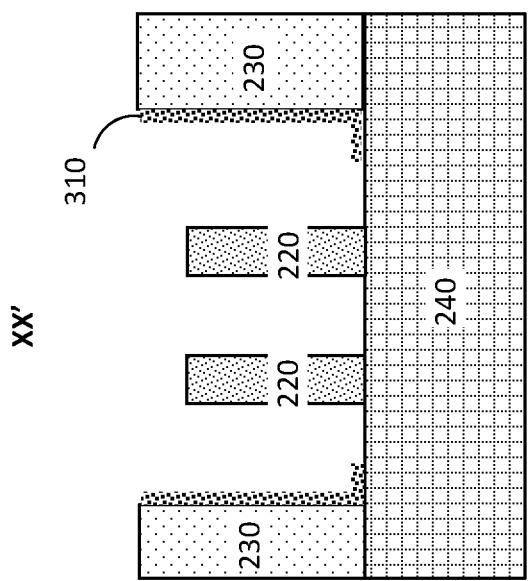

FIGS. 4C and 4D are cross-sectional side views through the XX' and ZZ' planes, respectively, after etching to remove the sacrificial patterning layer 242. The SiN liner 310 surrounding the sacrificial patterning layer 242 is removed by an RIE process that is tuned such that the SiN on the epitaxial contacts 210 and sidewalls of the ILD layer 230 are not removed.

Figure 5B:
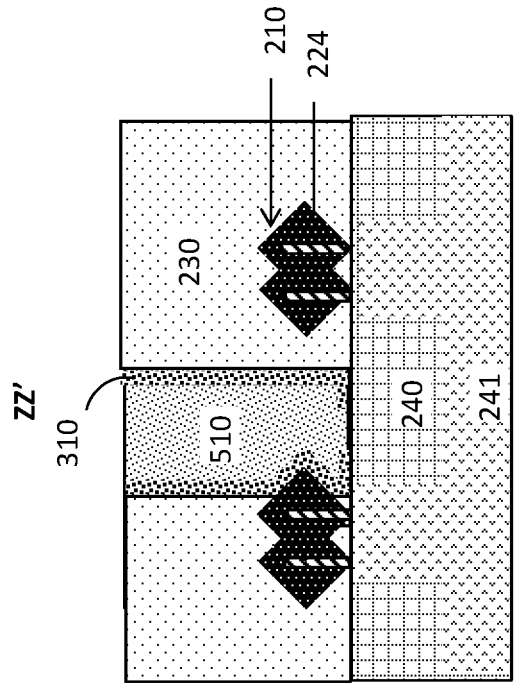
FIGS. 5A and 5B are cross-sectional side views through the XX' and ZZ' planes, respectively, after filling the interconnect pattern region with amorphous silicon and chemical mechanical planarization (CMP)
Figure 5A:
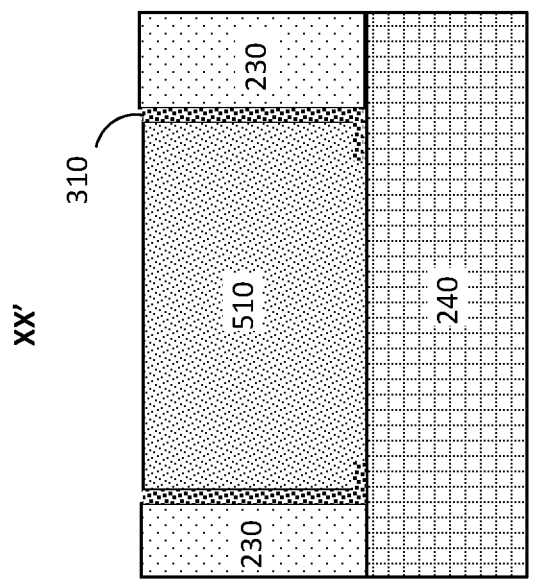

FIGS. 5A and 5B are cross-sectional side views through the XX' and ZZ' planes, respectively, after filling the interconnect gate region with amorphous silicon 510 and performing a CMP process. The amorphous silicon 510 forms the large interconnect on the gate level. CMP of the amorphous silicon is performed to selectively stop on the ILD layer 230.

Figure 5D:
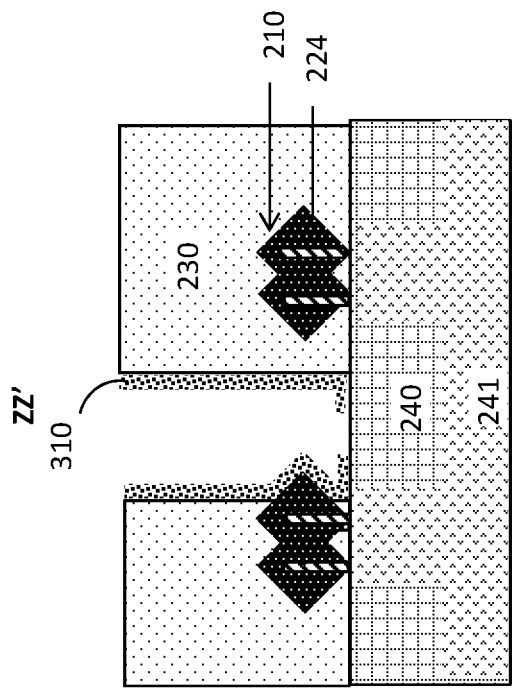
FIGS. 5C and 5D are cross-sectional side views through the XX' and ZZ' planes, respectively, after removing the amorphous silicon.
Figure 5C:
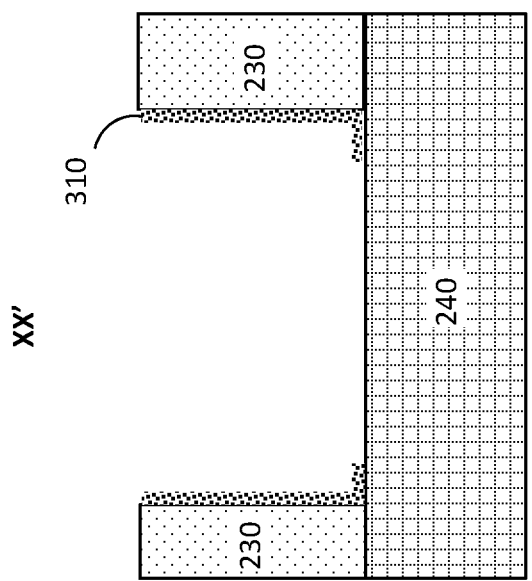

FIGS. 5C and 5D are cross-sectional side views through the XX' and ZZ' planes, respectively, after removing the amorphous silicon 510 from the gate interconnect. The amorphous silicon 510 is removed by an etching process selective to the ILD layer 230 and sacrificial gate oxide covering the fins (not shown).

Figure 6B:
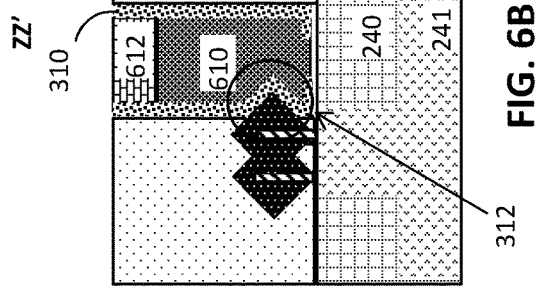
Figure 6A:
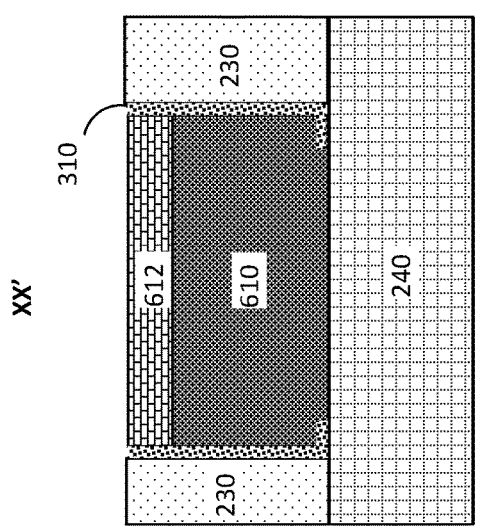
Figure 6C:
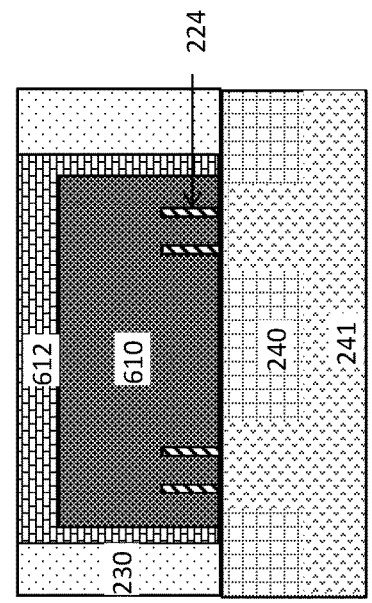

FIGS. 6A, 6B, and 6C are cross-sectional side views through the XX', ZZ', and YY' planes, respectively, after sacrificial gate oxide strip (not shown) and high-k oxide/metal gate stack 610 deposition into the open gate interconnect region. Sacrificial silicon oxide surrounding the fins 224 (not shown) is removed, and the fins 224 are cleaned. The gate stack 610 includes a high-k oxide, work function metal, and a gate metal. Non-limiting examples of suitable high-k oxides include hafnium dioxide, aluminum oxide, zirconium dioxide, hafnium silicate, zirconium silicate or any combination thereof. Non-limiting examples of suitable work function metals include aluminum, titanium, silver, copper, gold, or any combination thereof. Non-limiting examples of suitable gate metals include tungsten, tungsten titanium nitride, titanium, titanium nitride, tantalum, molybdenum, or any combination thereof. A self-aligned contact (SAC) cap 612 is deposited which includes a hard mask material, for example, SiN. A CMP process is performed over the SAC cap 612 to planarize the structure.

The SiN liner 310 remains over the epitaxial short region 312 after depositing the metal gate stack 610 and the SAC cap 612. The SiN liner 310 protects the epitaxial contact 224 from shorting to the gate interconnect. The SiN liner 310 will remain even after subsequent processing. The resulting structure is a gate-to-gate interconnect on the longitudinal plane as the gates (see FIG. 1C). The interconnect structure is formed on top of the substrate 241 (or part of the STI regions 240) in a region between the gates.

Figure 7B:
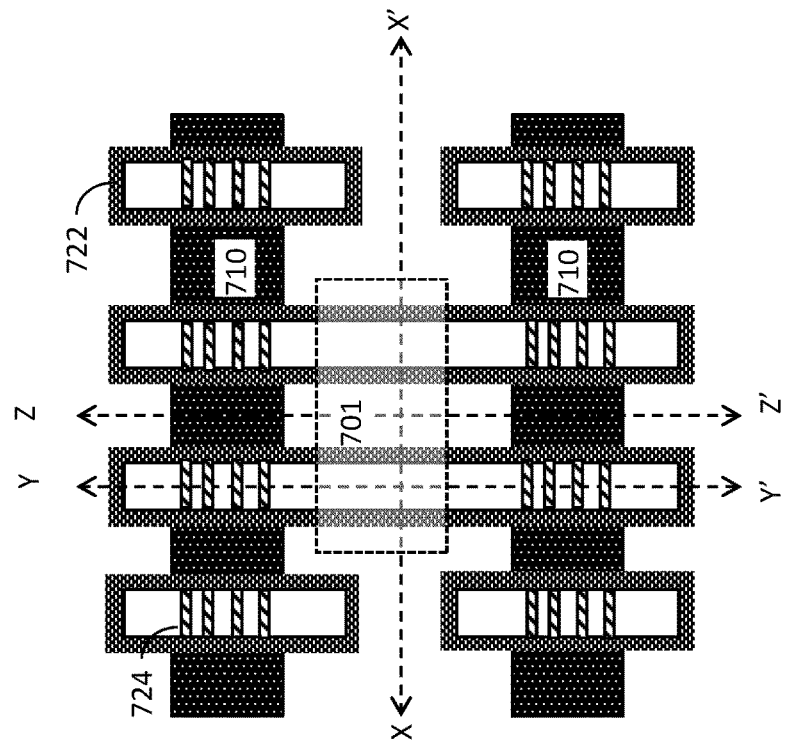
FIG. 7B is a top view of open gates over exposed fins after removing the amorphous silicon and sacrificial oxide.
Figure 7A:
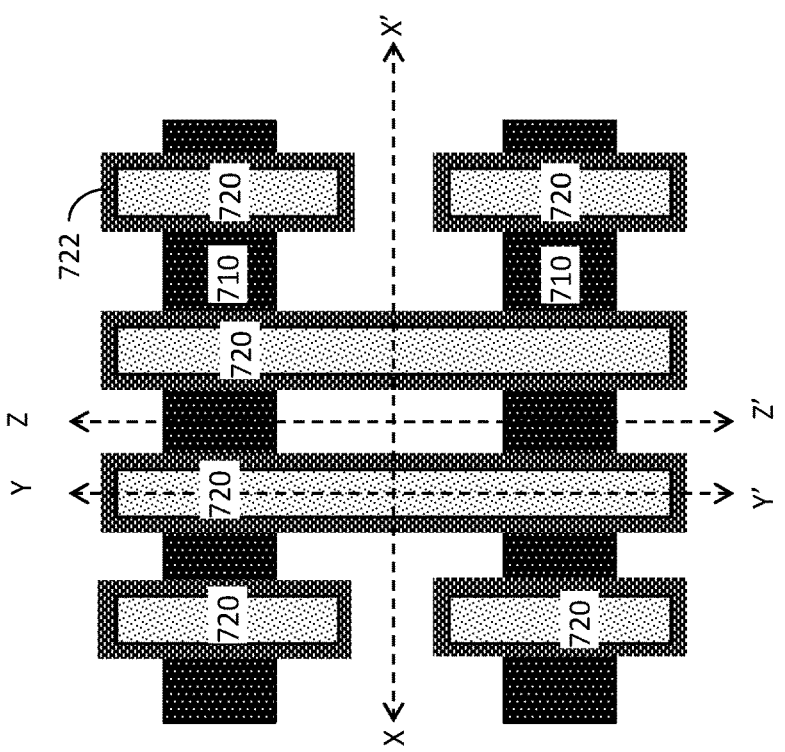

FIGS. 7A-9C illustrate a second embodiment for forming the gate-to-gate interconnect according to the present invention. FIG. 7A is a top view of amorphous silicon filled replacement gates 720 over epitaxial contacts 710 on fins as shown in FIG. 2A. The replacement gates 720 are surrounded by sidewall spacers 722.

Fins 724 are first patterned and etched into an underlying substrate 741 and sections of fins separated by STI regions 740. The fins 224 may be formed from a substrate 741 made of, for example, silicon, silicon germanium, or other suitable material. A STI process is performed to form the STI regions 740 to isolate local fin 724 sections.

Replacement gates 720 ("dummy gates") are formed over the fins 724. The replacement gates 720 are filled with a suitable replacement material, for example, amorphous silicon (polysilicon). An insulating hard mask layer, for example, silicon nitride (SiN), SiOCN, or SiBCN is deposited onto the replacement gate silicon to form a PC hard mask. The replacement gate 720 is then patterned and etched into the silicon and hard mask layer to form high aspect-ratio replacement gates over the substrate 740. An insulating liner material, for example, SiN, SiOCN, or SiBCN, is deposited over the replacement gates 720, and then a RIE process is performed to form spacers 722 surrounding the replacement gates 720.

To form the n-type (or p-type) epitaxial contacts 710 around the fins 724, an organic patterning stack (not shown) is applied over the p-type gate (or n-type gate) replacement gate 720 and patterned. A directional ME process is performed to remove the spacer 722 material to expose the underlying fins 724 (see FIG. 7D). An epitaxial growth process performed over the fins 724 forms the source and drain regions. The ILD layer 730 may be formed from, for example, a low-k dielectric oxide, including but not limited to, spin-on-glass, a flowable oxide, a high density plasma oxide, or any combination thereof.

FIG. 7B is a top view of open gate trenches over exposed fins 724 after removing the amorphous silicon and exposing the fins 724. The amorphous silicon is removed from the replacement gates 720 using a selective etching process to the sacrificial gate oxide protecting the fins (not shown).

Figure 7D:
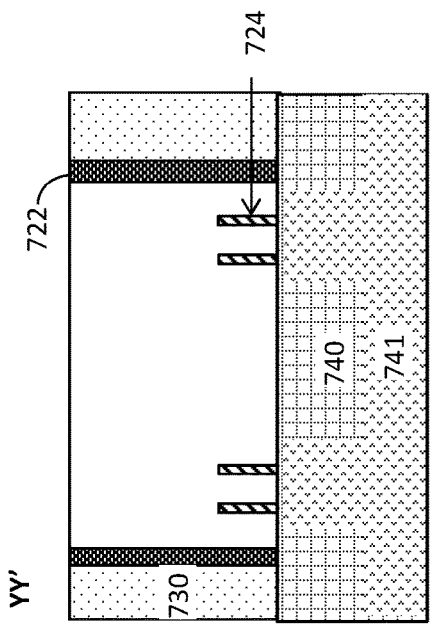
FIGS. 7C, 7D, and 7E are cross-sectional side views through the XX', YY', and ZZ' planes, respectively, of FIG. 7B.
Figure 7C:
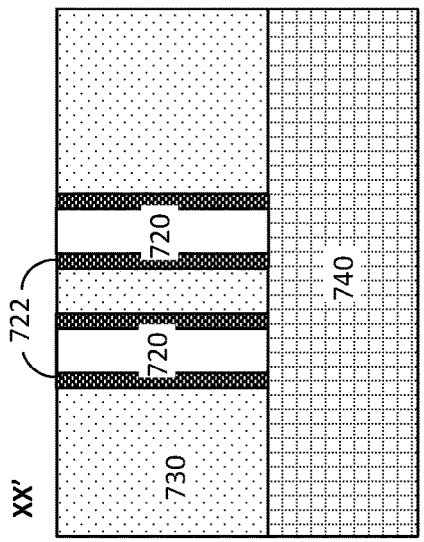
Figure 7E:
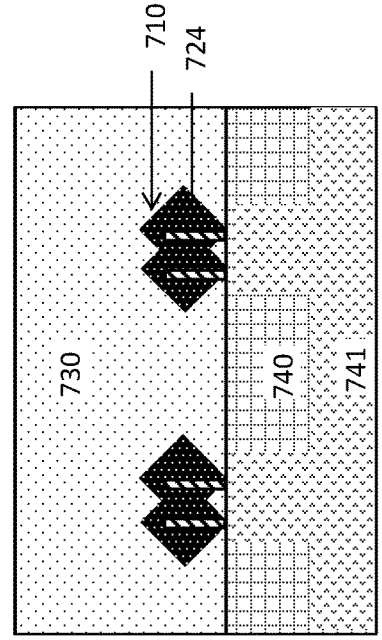

FIGS. 7C, 7D, and 7E are cross-sectional side views through the XX', YY', and ZZ' planes, respectively, of FIG. 7B. Note that, for simplicity, FIGS. 7A and 7B do not show the ILD layer 730 shown in FIGS. 7C, 7D, and 7E.

Figure 8B:
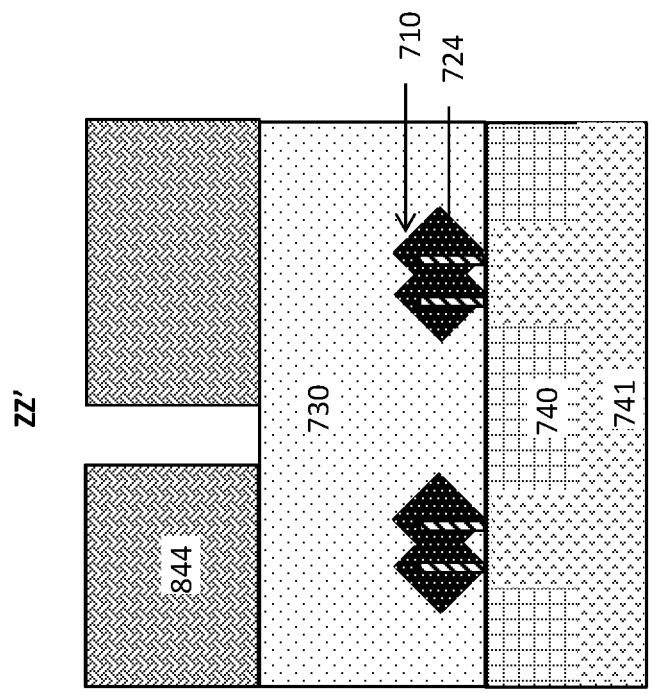
FIGS. 8A and 8B are cross-sectional side views through the XX' and ZZ' planes, respectively, after forming an interconnect patterning stack over the ILD layer.
Figure 8A:
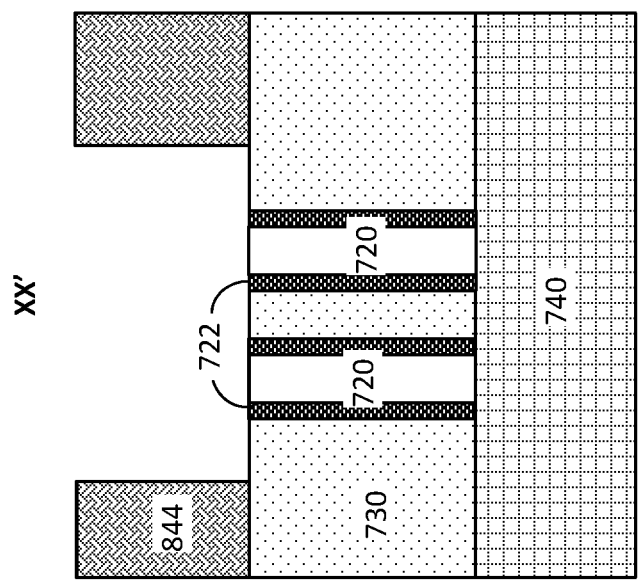

FIGS. 8A and 8B are cross-sectional side views through the XX' and ZZ' planes, respectively, after forming an interconnect patterning stack 844 over the ILD layer 730. The interconnect patterning stack 844 includes an OPL layer, anti-reflective ARC layer, and photoresist layer. The interconnect patterning stack 844 provides a pattern (see pattern 701 in FIG. 7B) for forming the interconnect between gates.

Figure 8D:
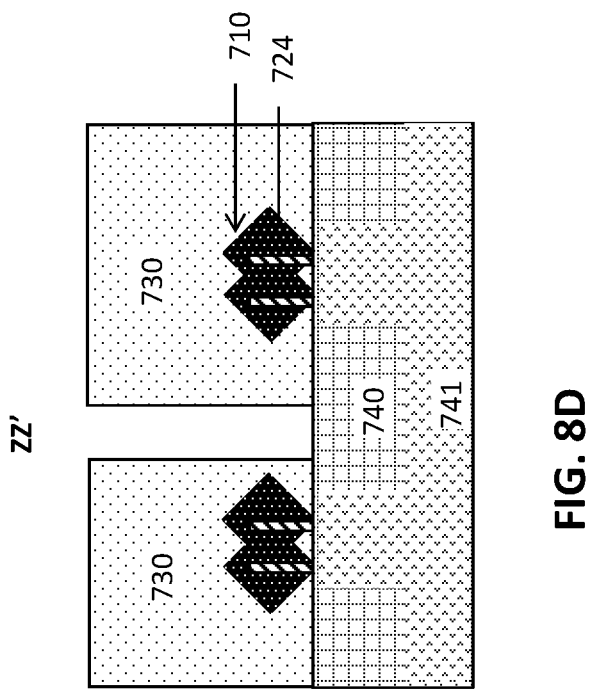
FIGS. 8C and 8D are cross-sectional side views through the XX' and ZZ' planes, respectively, after selective etching through the ILD layer and spacers.
Figure 8C:
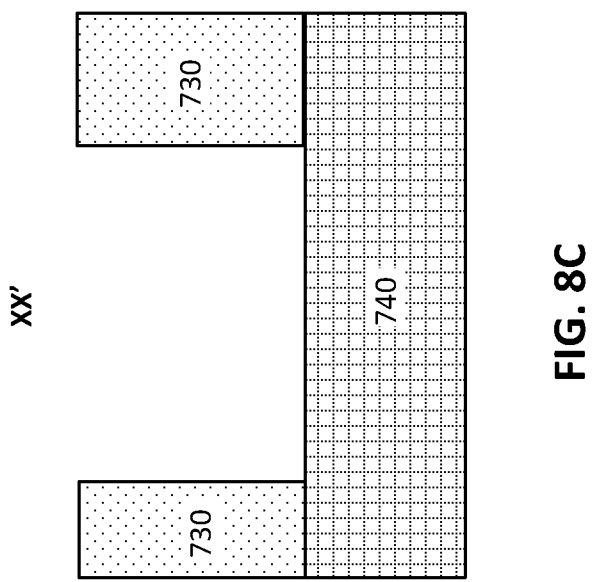

FIGS. 8C and 8D are cross-sectional side views through the XX' and ZZ' planes, respectively, after selective etching of the ILD layer 730 and spacers 722. The sidewall spacers 722 can be partially recessed during the etching process as long as the final local interconnection contains the required resistance value specified for device performance. This can additionally help prevent contact to gate shorting during contact RIE patterning and metal fill. The interconnect patterning stack 844 is then removed selective to a protective oxide covering the fins within the PC trench. The conformal protective oxide layer (not shown) surrounding the fins 724 is then removed by a COR process, and the fins 724 are cleaned.

FIGS. 9A, 9B, and 9C are cross-sectional side views through the XX', YY', and ZZ' planes, respectively, after metal gate stack 910 deposition. The metal gate stack 910 includes, for example, a high-k oxide, one or more work function metals, and one or more gate metals. The gate stack region will be further processed to form a SAC cap (not shown) like in FIGS. 6A-6C. The resulting structure is a gate-to-gate interconnect on the same parallel plane as the gates (see FIG. 1C). The interconnect structure is formed on top of the substrate 741 (or part of the STI regions 741) in a region between the gates.

Figure 10B:
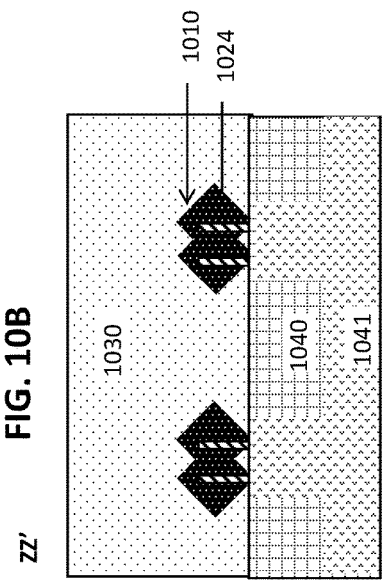
FIGS. 10B, 10C, and 10D are cross-sectional side views through the XX', YY', and ZZ' planes, respectively, of FIG. 10A.
Figure 10D:
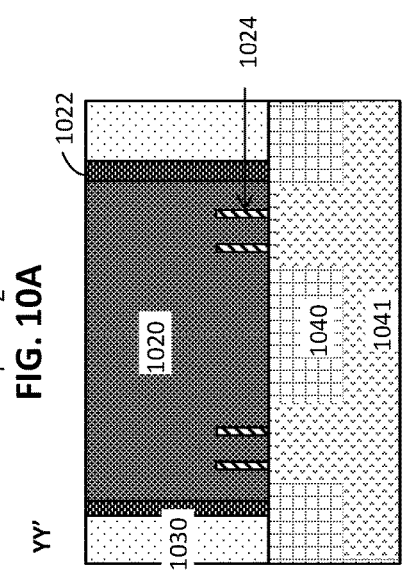
Figure 10A:
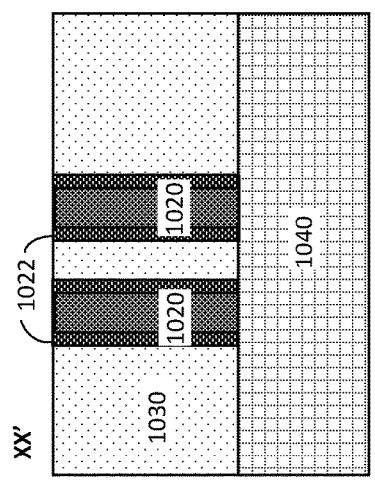

FIGS. 10A-11B illustrate a third embodiment for making the gate-to-gate interconnect according to the present invention. FIG. 10A is a top view of metal gate stacks 1020 over active fin channels after epitaxial contact deposition 1010 on fins. The metal gate stacks 1020 are surrounded by spacers 1022.

Figure 10C:
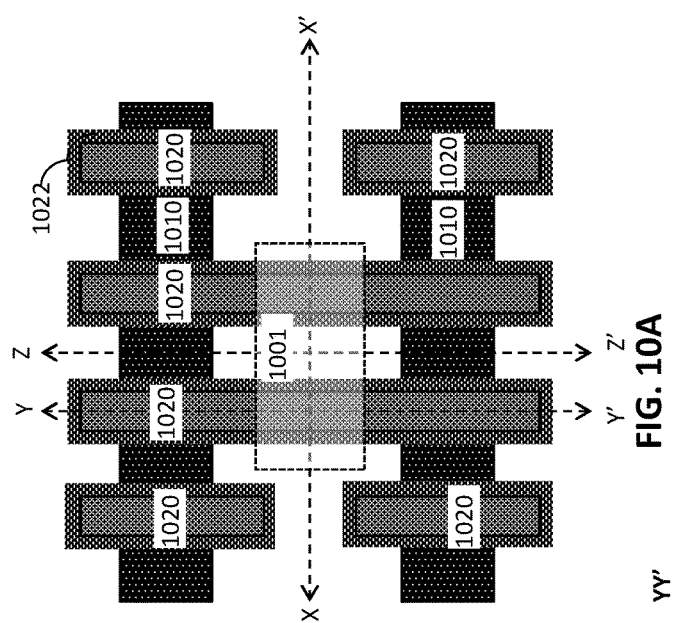

FIGS. 10B, 10C, and 10D are cross-sectional side views through the XX', YY', and ZZ' planes, respectively, of FIG. 10A. For simplicity, the ILD layer 1030 shown in FIGS. 10B, 10C, and 10D are not shown in FIG. 10A. Fins 1024 are patterned and etched into an underlying substrate 1041 separated by shallow trench isolation (STI) regions 1040. The fins 1024 may be formed from a substrate 1041 made of, for example, silicon, silicon germanium, or other suitable material. A STI process is performed to form the STI regions 1040 and isolate the fins 1024.

To form the metal gates 1020, initially, replacement gates (not shown) are formed over the fins 1024. The replacement gates are filled with a suitable replacement material, for example, amorphous silicon (polysilicon). An insulating hard mask layer, for example, silicon nitride (SiN), SiOCN, or SiBCN is deposited onto the replacement gate silicon to form a PC hard mask. The replacement gate is then patterned and etched into the silicon and hard mask layer to form high aspect-ratio replacement gates over the substrate 1041. An insulating liner material, for example, SiN, SiOCN, or SiBCN, is deposited over the replacement gates, and then a RIE process is performed to form spacers 1022 surrounding the replacement gates.

To form the n-type (or p-type) epitaxial contacts 1010 around the fins 1024, an organic patterning stack (not shown) is applied over the p-type gate (or n-type gate) replacement gate and patterned. A directional RIE process is performed to expose the underlying fins 1024. An epitaxial growth process over the fins 1024 forms the source and drain regions. The ILD layer 1030 is then deposited between gates and may be formed from, for example, a low-k dielectric oxide, including but not limited to, spin-on-glass, a flowable oxide, a high density plasma oxide, or any combination thereof. This ILD deposition is then followed by a planarization step to form a uniform surface topography.

The amorphous silicon within the replacement gates is removed. The conformal protective oxide layer (not shown) surrounding the fins 1024 is removed by a COR process, and the fins 1024 are cleaned. A metal gate stack 1020 is deposited into the open gates to form metal gates. The metal gate stack 1020 includes a high-k oxide, a work function metal, and a gate metal.

Figure 11B:
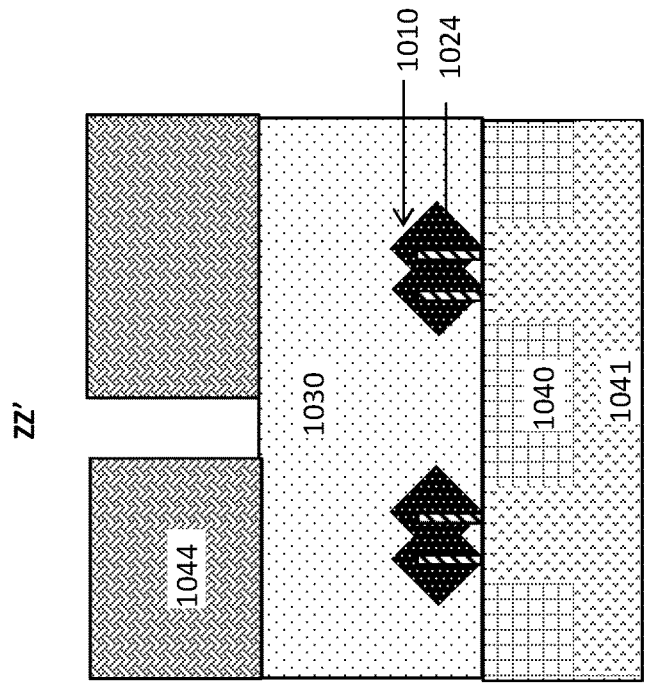
FIGS. 11A and 11B are cross-sectional side views through the XX' and and ZZ' planes, respectively, after forming an interconnect patterning stack over the ILD layer.
Figure 11A:
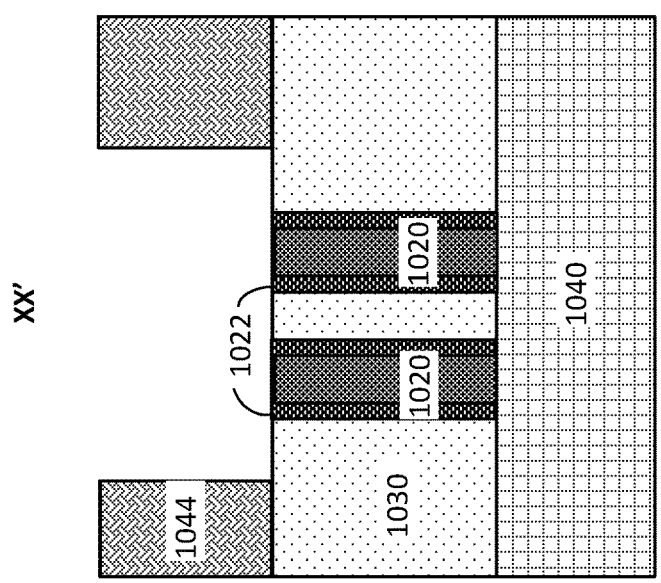

FIGS. 11A and 11B are cross-sectional side views through the XX' and and ZZ' planes, respectively, after forming an interconnect patterning stack 1044 over the ILD layer 1030 and metal gate stacks 1020. The interconnect patterning stack 1044 includes an OPL layer, ARC layer, and photoresist layer. The interconnect patterning stack 1044 provides an interconnect pattern (see pattern 1001 in FIG. 10A) for forming the interconnect between gates.

Figure 11D:
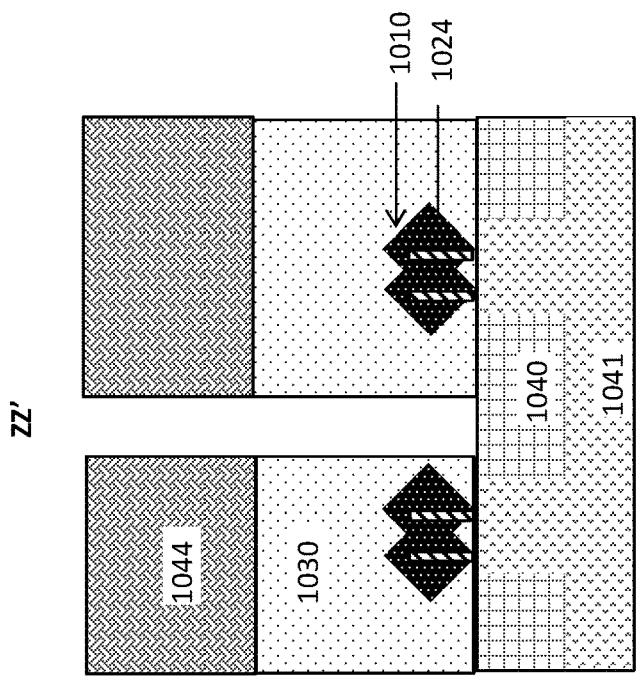
FIGS. 11C and 11D cross-sectional side views through the XX' and and ZZ' planes, respectively, after selective etching through the ILD layer and spacers.
Figure 11C:
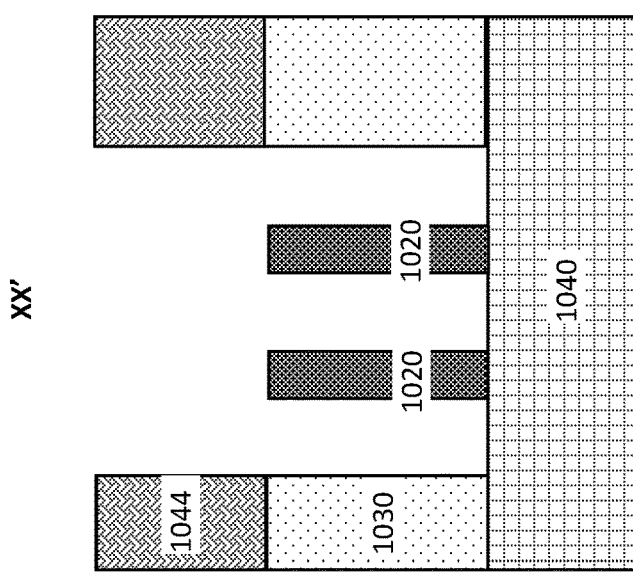

FIGS. 11C and 11D cross-sectional side views through the XX' and and ZZ' planes, respectively, after selective etching through the ILD layer 1030 and high-k oxide 1022. Then, the interconnect patterning stack 1044 is removed.

Figure 12B:
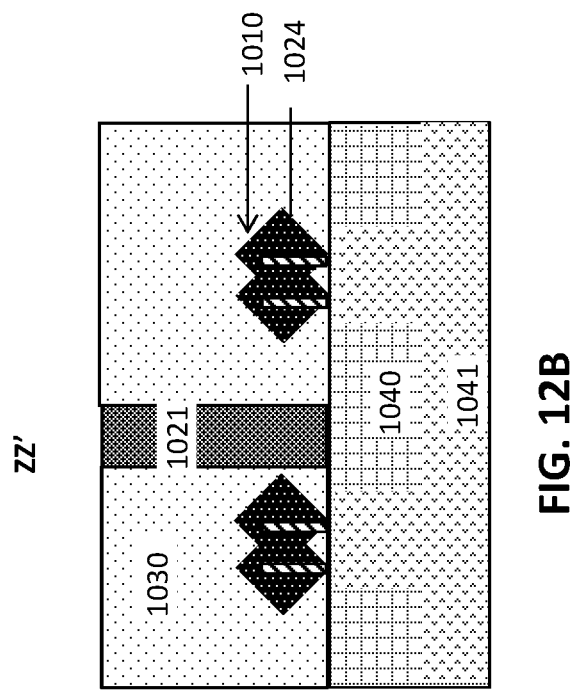
Figure 12A:
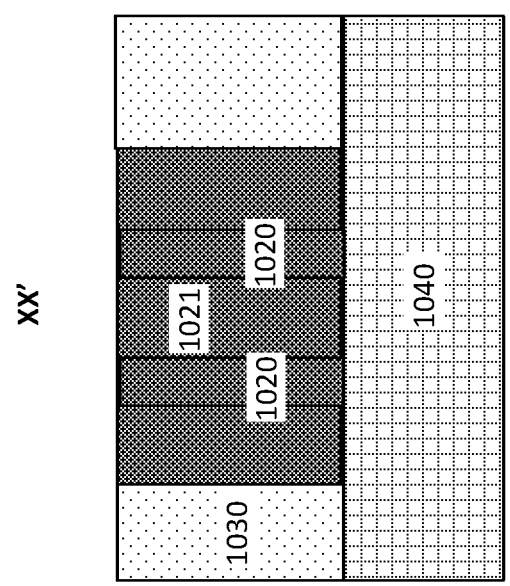

FIGS. 12A and 12B cross-sectional side views through the XX' and ZZ' planes, respectively, after filling the interconnect region with a gate metal 1021 (e.g., tungsten), followed by a CMP process to form the gate-to-gate interconnect as shown in FIG. 1C. The gate stack region will be further processed to form a SAC cap (not shown) like in FIGS. 6A-6C. The interconnect structure is formed on top of the substrate 1041 (or part of the STI regions 1040) in a region between the gates.

In addition to the above embodiments for forming the gate-to-gate interconnect, the local interconnect structure may be formed by other methods. For example, in another non-limiting embodiment, the interconnect structure may be formed like the process shown FIGS. 10A-11B, except that the interconnect pattern is formed after removing amorphous silicon from the replacement gates and depositing a high-k oxide layer into the open gate region (before depositing the remaining materials of the metal gate stack (work function metal and gate metal). Interconnect patterning and selective etching of the ILD layer and spacers is then performed as in FIGS. 10A-10D. Then the interconnect region surrounding the gates and the region within the open gates (which are only lined by the high-k oxide) is filled with a high work function metal and a gate metal to form the gate-to-gate interconnect structure shown in FIG. 1C.

The above gate-to-gate contact (local interconnect) described in various embodiments forms a bridge between adjacent gates, which eliminates the problem of shorting due to fin and gate contact overlap, or CB overlay alignment offset issues to the underlying gates.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for making a self-aligned interconnect structure, the method comprising:
   forming a first gate and a second gate over a source/drain contact, the first gate and the second gate comprising a replacement gate material;
   patterning an interconnect structure in an interconnect patterning stack between the first gate and the second gate such that the interconnect structure pattern laterally connects the first gate and the second gate; and
   filling the interconnect patterning stack, the first gate, and the second gate with a gate metal to form an interconnect structure that laterally connects the first gate and the second gate and directly contacts the substrate.

2. The method of claim 1, wherein the first gate and the second gate each comprises amorphous silicon before patterning the contact.

3. The method of claim 1, wherein the first gate and the second gate each comprises polysilicon.

4. The method of claim 1, wherein an inter-layer dielectric layer (ILD) layer surrounds the source/drain contact.

5. The method of claim 1, wherein the source/drain contact is an epitaxial contact.

6. The method of claim 1 further comprising, prior to patterning the interconnect structure, performing an etching process to remove the replacement gate material and expose fins beneath the first gate and the second gate.

7. The method of claim 6, wherein the etching process is a directional etching process.

8. The method of claim 7, wherein the directional etching process is a reactive ion etching process.

9. The method of claim 1, wherein the interconnect patterning stack comprises a planarization layer, an anti-reflective layer, a photoresist layer, or a combination thereof.

10. The method of claim 1, wherein each of the first gate and the second gate comprises sidewall spacers.

11. The method of claim 10, wherein the sidewall spacers are SiN, SiOCN, SiBCN, or a combination thereof.

12. The method of claim 10 further comprising, prior to filling the interconnect patterning stack, the first gate, and the second gate with a gate metal, partially recessing the gate spacers.

13. The method of claim 1 further comprising depositing a high-k oxide and a high work function metal before filling with the gate metal.

14. The method of claim 1, wherein the first gate and the second gate are arranged on a plurality of fins.

15. The method of claim 14, wherein the plurality of fins comprise silicon, silicon germanium, or a combination thereof.

16. The method of claim 14, wherein each of the plurality of fins are separated by shallow trench isolation regions.

17. The method of claim 1, wherein each of the first gate and the second gate comprises a hard mask.

18. The method of claim 17, wherein the hardmask comprises SiN, SiOCN, SiBCN, or a combination thereof.

19. The method of claim 1, wherein each of the first gate or second gate is an n-type gate or a p-type gate.

20. The method of claim 1, wherein an epitaxial source/drain region is arranged beneath the source/drain contact.

* * * * *